(12) United States Patent
Jia et al.

(10) Patent No.: US 8,563,341 B2
(45) Date of Patent: Oct. 22, 2013

(54) THIN FILM TRANSISTOR ARRAY SUBSTRATE AND MANUFACTURING METHOD FOR THE SAME

(75) Inventors: Pei Jia, Shenzhen (CN); Liu-yang Yang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 13/498,470

(22) PCT Filed: Feb. 8, 2012

(86) PCT No.: PCT/CN2012/070946
§ 371 (c)(1),
(2), (4) Date: Mar. 27, 2010

(87) PCT Pub. No.: WO2013/116992
PCT Pub. Date: Aug. 15, 2013

(65) Prior Publication Data
US 2013/0200383 A1 Aug. 8, 2013

(30) Foreign Application Priority Data
Feb. 6, 2012 (CN) .......................... 2012 1 0025334

(51) Int. Cl.
*H01L 21/00* (2006.01)
(52) U.S. Cl.
USPC ............. 438/30; 438/149; 438/151; 438/152; 438/153; 257/59; 257/66; 257/72

(58) Field of Classification Search
USPC .......... 438/30, 149, 151–153; 257/66, 59, 72, 257/E51.018, E33.072
See application file for complete search history.

(56) References Cited

U.S. PATENT DOCUMENTS

| 7,091,070 B2* | 8/2006 | Imai et al. ..................... 438/149 |
| 2005/0023525 A1* | 2/2005 | Ishikawa ......................... 257/59 |

* cited by examiner

*Primary Examiner* — Theresa T Doan
(74) *Attorney, Agent, or Firm* — Ditthavong Mori & Steiner, P.C.

(57) ABSTRACT

The present invention discloses a thin film transistor array substrate and a manufacturing method for the same. A transparent conductive layer and a first metal layer are deposited on a substrate, and a multi-tone mask is utilized to form a gate electrode and a common electrode. A gate insulative layer and a semi-conductive layer are deposited on the substrate with the gate electrode and the common electrode, and the semi-conductive layer is patterned by a second mask to retain a region of the semi-conductive layer that is there-above the gate electrode. A second metal layer is deposited on the substrate with the gate insulative layer along with the retained semi-conductive layer, and the second metal layer is patterned by a third mask to form a source electrode, a drain electrode, and a pixel electrode. The present invention provides a simple manufacturing method.

16 Claims, 3 Drawing Sheets

THIN FILM TRANSISTOR ARRAY SUBSTRATE AND MANUFACTURING METHOD FOR THE SAME

BACKGROUND OF THE INVENTION

1. Field of the Invention

The present invention relates to a field of liquid crystal display manufacturing technology, and more particularly, to a thin film transistor array substrate and a manufacturing method for the same.

2. Description of the Prior Art

With increasing popularization of liquid crystal displays, there is a high demand of greater display performance of liquid crystal displays. Fringe field switching (FFS) mode liquid crystals have higher penetrability and wider viewing angles, hence are gradually become a common technology in the field of liquid crystal displays.

In a method for manufacturing a thin film transistor (TFT) array substrate of the liquid crystal display, a photo-lithography is required to be processed by several masks. However, masks are quite expensive, hence, a thin film transistor (TFT) array substrate which requires more masks in manufacturing will be made with higher costs, more time, and more complex process.

Therefore, the prior art thin film transistor array substrate of an FFS liquid crystal display which is formed by several masks (such as four masks) has disadvantages of complex and more difficult manufacture process, and higher costs, thereby increasing production difficulty of the liquid crystal displays.

Therefore, there is a need to provide a thin film transistor array substrate and a manufacturing method for the same, so as to overcome the disadvantages in the prior art.

BRIEF SUMMARY OF THE INVENTION

An object of the present invention is to provide a method for manufacturing a thin film transistor array substrate to overcome the disadvantages in the prior art manufacturing method of having higher manufacturing costs and complex processes. The thin film transistor array substrate of an FFS liquid crystal display which is formed by several masks (such as four masks) has the above disadvantages.

To overcome the above-mentioned disadvantages, the present invention provides a method for manufacturing the thin film transistor array substrate, such that the method includes the following steps: providing a substrate; depositing sequentially a transparent conductive layer and a first metal layer on the substrate by a sputtering process, and patterning the transparent conductive layer and the first metal layer by a multi-tone mask forming a gate electrode and a common electrode, such that the gate electrode comprises the transparent conductive layer and the first metal layer, and the common electrode is being formed by the transparent conductive layer; depositing sequentially a gate insulative layer and a semi-conductive layer on the substrate which has the gate electrode and the common electrode, and patterning the semi-conductive layer by a second mask for retaining a region of the semi-conductive layer that is there-above the gate electrode; depositing a second metal layer on the substrate with the gate insulative layer along with the retained semi-conductive layer, and patterning the second metal layer by a third mask to form a source electrode and a drain electrode on the retained semi-conductive layer, wherein a pixel electrode is formed by the second metal layer on the gate insulative layer corresponding to the common electrode; depositing a planarization layer on the pixel electrode and on the source electrode, the drain electrode and the retained semi-con providing a substrate ductor layer of a thin film transistor, wherein the planarization layer is formed of a transparent insulating material.

In the method for manufacturing the thin film transistor array substrate of the present invention, the multi-tone mask is selected one group consisting of a gray tone mask, a stacked layer mask, and a half tone mask.

In the method for manufacturing the thin film transistor array substrate of the present invention, the gate insulative layer and the semi-conductive layer are sequentially deposited by chemical vapor deposition method.

In the method for manufacturing the thin film transistor array substrate of the present invention, the second metal layer is formed by the sputtering process.

In the method for manufacturing the thin film transistor array substrate of the present invention, the first metal layer is formed by a first aluminum metal layer and a first molybdenum metal layer being sequentially deposited, and the second metal layer is formed by a second molybdenum metal layer, a second aluminum metal layer and a third molybdenum metal layer being sequentially deposited.

In the method for manufacturing the thin film transistor array substrate of the present invention, in the step of patterning the transparent conductive layer and the first metal layer by the multi-tone mask, the first metal layer is etched by a mixture of nitric acid, phosphoric acid and acetic acid, and the transparent conductive layer is etched by oxalic acid.

In the method for manufacturing the thin film transistor array substrate of the present invention, in the process for patterning the second metal layer by a third mask, the second metal layer is etched by a mixture of nitric acid, phosphoric acid, and acetic acid.

An another object of the present invention is to provide the method for manufacturing the thin film transistor array substrate, so as to overcome the disadvantage which includes the intricate manufacturing method, higher manufacturing difficult and costs in the prior art. The thin film transistor array substrate of the FFS liquid crystal display is formed by several masks process (such as four-mask process) to produce above disadvantage.

To overcome the above disadvantage, the present invention provides the method for manufacturing the thin film transistor array substrate, and the method includes the following steps: providing the substrate; depositing sequentially a transparent conductive layer and a first metal layer on the substrate, and patterning the transparent conductive layer and the first metal layer by a multi-tone mask forming a gate electrode and a common electrode, such that the gate electrode includes the transparent conductive layer and the first metal layer, and the common electrode is formed by the transparent conductive layer; depositing sequentially a gate insulative layer and a semi-conductive layer on the substrate with the gate electrode and the common electrode, and patterning the semi-conductive layer by a second mask so that there is a region of the semi-conductive layer being retained there-above the gate electrode; depositing a second metal layer on the substrate with the gate insulative layer along with the retained semi-conductive layer, and patterning the second metal layer by a third mask to form a source electrode and a drain electrode on the retained semi-conductive layer, wherein a pixel electrode is formed by the second metal layer on the gate insulative layer corresponding to the common electrode.

In the method for manufacturing the thin film transistor array substrate of the present invention, the method further includes the step of depositing a planarization layer on the pixel electrode and on the source electrode, the drain electrode and the retained semi-conductor layer of the thin film transistor, wherein the planarization layer is formed of the transparent insulating material.

In the method for manufacturing the thin film transistor array substrate of the present invention, the multi-tone mask is selected one group consisting of a gray tone mask, a stacked layer mask, and a half tone mask.

In the method for manufacturing the thin film transistor array substrate of the present invention, the transparent conductive layer and the first metal layer are sequentially formed by the sputtering process.

In the method for manufacturing the thin film transistor array substrate of the present invention, the gate insulative layer and the semi-conductive layer are sequentially deposited by chemical vapor deposition method.

In the method for manufacturing the thin film transistor array substrate of the present invention, the second metal layer is formed by the sputtering process.

In the method for manufacturing the thin film transistor array substrate of the present invention, the first metal layer is formed by a first aluminum metal layer and a first molybdenum metal layer being sequentially deposited, and the second metal layer is formed by a second molybdenum metal layer, a second aluminum metal layer and a third molybdenum metal layer being sequentially deposited.

In the method for manufacturing the thin film transistor array substrate of the present invention, in the step of patterning the transparent conductive layer and the first metal layer by the multi-tone mask, the first metal layer is etched by a mixture of nitric acid, phosphoric acid and acetic acid, and the transparent conductive layer is etched by oxalic acid.

In the method for manufacturing the thin film transistor array substrate of the present invention, in the process for patterning the second metal layer by a third mask, the second metal layer is etched by a mixture of nitric acid, phosphoric acid, and acetic acid.

The object of the present invention is to provide the thin film transistor array substrate, so as to overcome the disadvantage which includes the intricate manufacturing method, higher manufacturing difficult and costs in the prior art. The thin film transistor array substrate of the FFS liquid crystal display is formed by several masks process (such as four-mask process) to produce above disadvantage.

To overcome the above-mentioned disadvantages, the present invention provides a thin film transistor array substrate, the thin film transistor array substrate includes a substrate, a plurality of thin film transistors which is disposed on the substrate, wherein each of the thin film transistor includes a gate electrode, a gate insulative layer, a semi-conductive layer, a source electrode and a drain electrode, the gate electrode, the gate insulative layer, the semi-conductive layer, the source electrode and the drain electrode are sequentially formed on the substrate, the gate electrode includes a transparent conductive layer and a first metal layer the source electrode and the drain electrode are formed by the second metal layer, a common electrode being formed of the transparent conductive layer, and a plurality of pixel electrodes which being formed by the second metal layer on the gate insulative layer corresponding to the common electrode, and the pixel electrodes mutually connecting the drain electrode.

In the thin film transistor array substrate of the present invention, the first metal layer is formed by the first aluminum metal layer and the first molybdenum metal layer being sequentially deposited, and the second metal layer is formed by a second molybdenum metal layer, a second aluminum metal layer and a third molybdenum metal layer being sequentially deposited.

The thin film transistor array substrate of the FFS liquid crystal display of the present invention is formed by the following steps: performing the multi-tone mask process after the process for sequentially depositing the transparent conductive layer and the first metal layer on the substrate; performing the second mask process after the process for sequentially depositing the gate insulative layer and the semi-conductive layer on above substrate; then performing the third mask process after the process for depositing the second metal layer on above substrate than prior art. Apparently, the thin film transistor array substrate of the FFS liquid crystal display of the present invention is formed by three masks. The present invention has advantages of manufacturing method simplicity, lower manufacturing difficult and costs, thereby increasing production of liquid crystal displays.

The above objectives, other objectives, features, advantages and embodiments of the present invention will be better understood from the following description being considered in connection with the accompanied drawings and in which a preferred embodiment of the invention is illustrated by way of example.

DETAILED DESCRIPTION OF THE PREFERRED EMBODIMENTS

Figure 1:
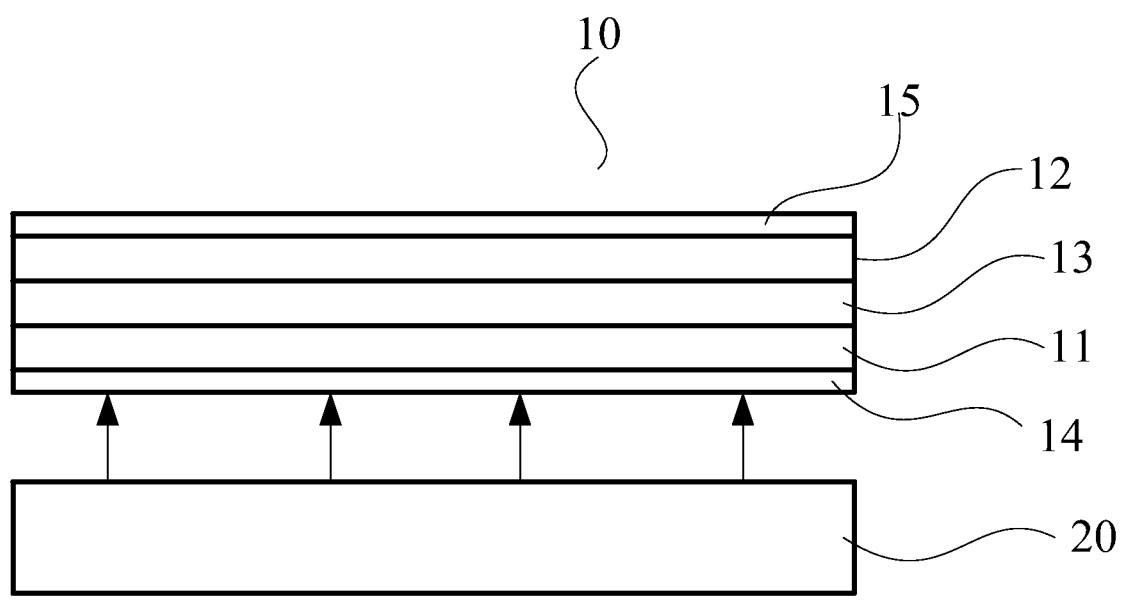
FIG. 1 is a profile view of a liquid crystal panel and backlight module according to a preferred embodiment of the present invention.

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "left," "right," "inside," "outside," "side," etc., is used with reference to the orientation of the Figure(s) being described. As such, the directional terminology is used for purposes of illustration and is in no way limiting.

Throughout this specification and in the drawings like parts will be referred to by the same reference numerals.

Please refer to FIG. 1. FIG. 1 is a profile view of a liquid crystal panel and backlight module according to one embodiment of the present invention. A manufacturing method of a thin film transistor array substrate of the embodiment of the present invention can be applied to the manufacturing method of a liquid crystal panel 10 (such as a liquid crystal display panel) to manufacture a protective layer of a transistor. When manufacturing a liquid crystal display device by the manufacturing method of the liquid crystal panel 10 according to the present invention, the liquid crystal panel 10 is disposed on a backlight module 20 to form the liquid crystal display device. The liquid crystal panel 10 includes a first substrate 11, a second substrate 12, a liquid crystal layer 13, a first polarizing sheet 14, and a second polarizing sheet 15. The first substrate 11 and the second substrate 12 can be a glass substrate or a flexible plastic substrate. In embodiment of the present invention, the first substrate is a thin film transistor array substrate, and the second substrate is a color filter substrate. Remarkably, the thin film transistor and the thin film transistor array can be disposed on the same substrate in some embodiments.

Please refer to FIG. 1 again, the liquid crystal layer 13 is formed in between the first substrate 11 and the second substrate 12. The first polarizing sheet 14 is disposed at one side of the first substrate 11, and opposite to the liquid crystal layer 13 (known as an incident light side of the first substrate 11). The second polarizing sheet 15 is disposed at one side of the second substrate 12, and opposite to the liquid crystal layer 13 (known as a light-emitting side of the second substrate 12).

FIGS. 2A to 2E is a profile view of a manufacturing procedure of the thin film transistor array substrate in the liquid crystal panel according to the preferred embodiment of the present invention.

Please refer to FIG. 2, provided is a substrate 110, and a transparent conductive layer 120 and a first metal layer 130 are sequentially deposited on the substrate 110.

Preferably, the transparent conductive layer 120 is formed of transparent conductive metals. The transparent conductive metals include indium tin oxide (ITO), tin oxide (TO), indium zinc oxide (IZO), and indium tin zinc oxide (ITZO).

Preferably, the first metal layer 130 is made of a first aluminum metal layer and a first molybdenum metal layer, other materials such as silver (Ag), copper (Cu), chromium (Cr), tungsten (W), tantalum (Ta), titanium (Ti), metal nitride, or any combination thereof can be utilized, as well as a multi-layer structure made of a heat-resistant metal film and a low-resistivity film.

Figure 2A:
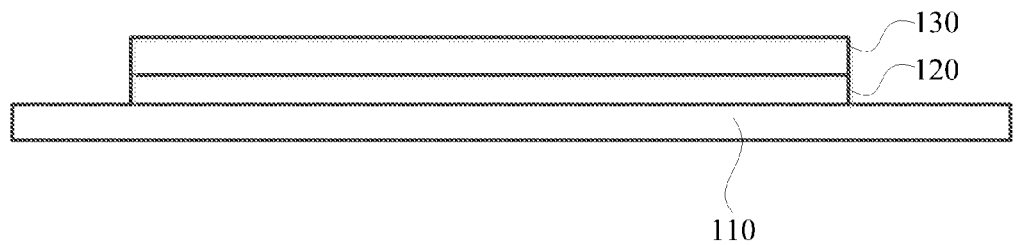
FIGS. 2A to 2E is a flow chart of a method according to the preferred embodiment of the present invention for manufacturing a thin film transistor array substrate.
Figure 2B:
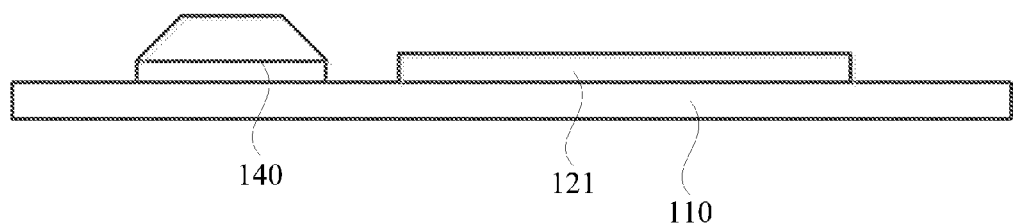

Please refer to FIG. 2B, the transparent conductive layer 120 and the first metal layer 130 of FIG. 2A are patterned by a multi-tone mask is utilized to form a gate electrode 140 and a common electrode 121. Wherein, the gate electrode 140 includes the transparent conductive layer 120 and the first metal layer 130, and the common electrode 121 is formed by the transparent conductive layer 120 on the substrate 110.

In a process of a specific embodiment, the transparent conductive layer 120 and the first metal layer 130 are preferably formed by a sputtering process on the substrate 110. The transparent conductive layer 120 and the first metal layer 130 are patterned by a photolithography process and an etching process of the multi-tone mask to form the gate electrode 140, and to form the common electrode 121 on the transparent conductive layer 120 of the substrate 110.

In the process of the specific embodiment, the multi-tone mask is performed by a multi-tone photo mask. The multi-tone photo mask can be a gray tone mask (GTM), a stacked layer mask (SLM), or a half tone mask (HTM), etc. The transparent conductive layer 120 and the first metal layer 130 are patterned by the multi-tone photo mask which includes an exposure area, a partial exposure area and a non-exposure area to form the gate electrode 140, and to form the common electrode 121 on the transparent conductive layer 120 of the substrate 110.

Wherein, in the process for patterning the transparent conductive layer 120 and the first metal layer 130 by the multi-tone mask, the first metal layer 130 is preferably etched by a mixture of nitric acid, phosphoric acid and acetic acid, and the transparent conductive layer 120 is preferably etched by oxalic acid, and forming a structure of FIG. 2B. The etching process includes many other methods, one by one not listed here.

Figure 2C:
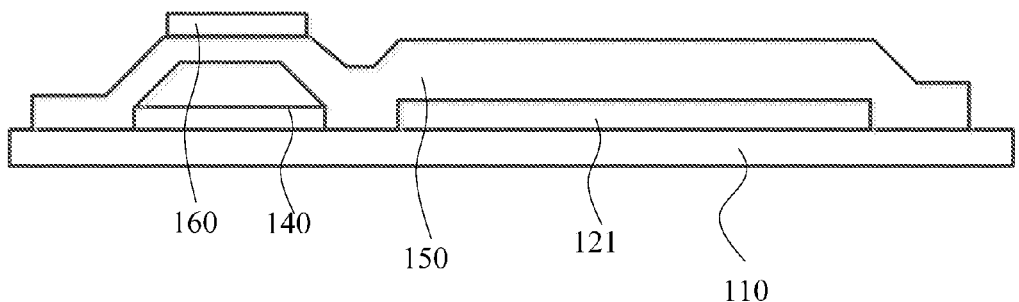

Please refer to FIG. 2C, a gate insulative layer 150 and a semi-conductive layer 160 are sequentially deposited on the substrate 110 with the gate electrode 140 and the common electrode 121, and the semi-conductive layer 160 is patterned by a second mask so that a region of the semi-conductive layer 160 is retained there-above the gate electrode 140, and forming a structure of FIG. 2C.

The gate insulative layer 150 and the semi-conductive layer 160 are preferably deposited by chemical vapor deposition method according to the present invention, such as plasma enhanced chemical vapor deposition (PECVD). A depositing process includes many other methods, one by one not listed here.

The materials of the gate insulative layer 150 include silicon nitride (SiNx) or silicon oxide (SiOx). Preferably, the material of the semi-conductive layer 160 is poly-silicon. An amorphous silicon layer is first deposited on a surface of a support element layer (not shown in the figure), and the amorphous silicon layer are annealed by rapid thermal annealing process to form a poly-silicon layer according to the manufacturing method of the semi-conductive layer 160 of the present invention.

Figure 2D:
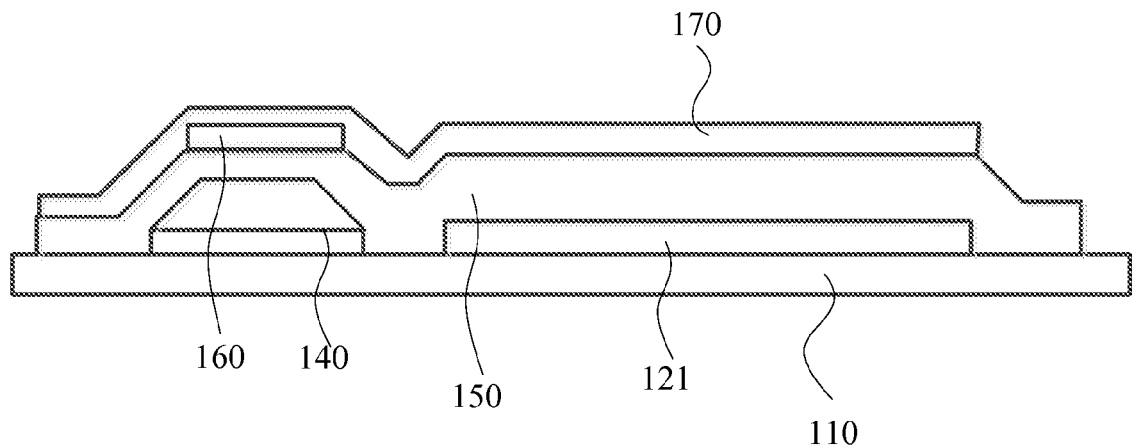

Please refer to FIG. 2D, a second metal layer 170 is deposited on the substrate 110 with the gate insulative layer 150 and the retained semi-conductive layer 160.

The second metal layer 170 is preferably formed by the sputtering process according to the present invention. Preferably, a second molybdenum metal layer, a second aluminum metal layer and a third molybdenum metal layer are sequentially deposited to form the second metal layer 170, that further includes other materials, such as silver (Ag), copper (Cu), chromium (Cr), tungsten (W), tantalum (Ta), titanium (Ti), metal nitride, or any combination thereof can also be utilized, as well as a multi-layer structure made of a heat-resistant metal film and a low-resistivity film.

Figure 2E:
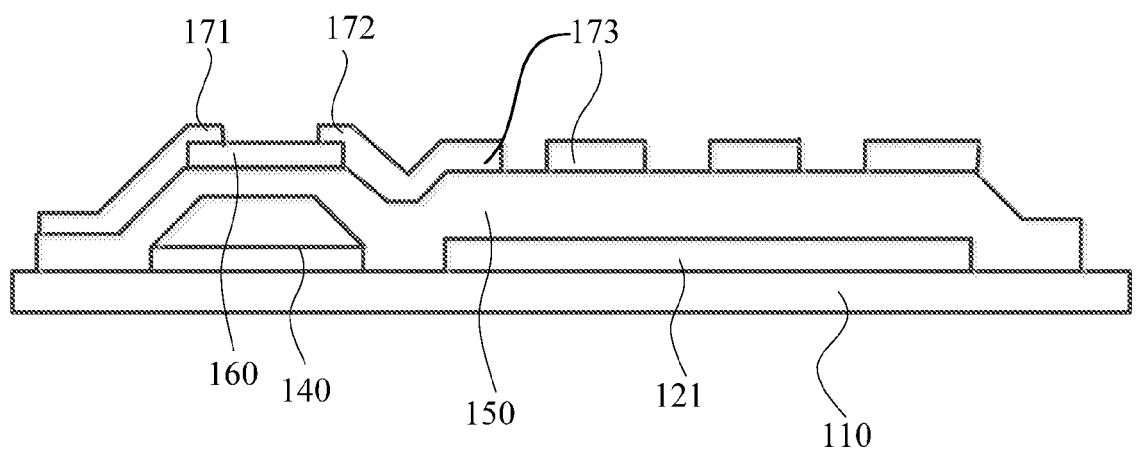

Please refer to FIG. 2E, the second metal layer 170 is patterned by a third mask to form a source electrode 171 and a drain electrode 172 on the retained semi-conductive layer 160, wherein a pixel electrode 173 is formed by the second metal layer 170 on the gate insulative layer 150 corresponding to the common electrode 121. Wherein, the pixel electrode 173 is contacted with the drain electrode 172, and the gate insulative layer 150 separates the common electrode 121 and the pixel electrode 173.

In the process for patterning the second metal layer 170 by a third mask to form the source electrode 171, the drain electrode 172, and the pixel electrode 173, the second metal layer 170 is preferably etched by a mixture of nitric acid, phosphoric acid, and acetic acid.

In one exemplary embodiment, a planarization layer (not shown in the figure) can be deposited on the pixel electrode 173, a thin film transistor to achieve planarization and protection of components following structural formation of FIG. 2E. Wherein, the thin film transistor includes the source electrode 171, a drain electrode 172, and a retained semi-conductive layer 160. Preferably, the planarization layer is formed of a transparent insulating material, the planarization layer also includes other materials, one by one not listed here.

Furthermore, the present invention provides the thin film transistor array substrate. The thin film transistor array substrate includes the substrate 110, the common electrode 121, and a plurality of thin film transistors. Wherein, the common electrode 121 and the thin film transistors are disposed on the substrate 110.

The thin film transistor includes a gate electrode 140, a gate insulative layer 150, a semi-conductive layer 160, a source electrode 171, and a drain electrode 172. The gate electrode 140, gate insulative layer 150, semi-conductive layer 160, source electrode 171 and a drain electrode 172 are sequentially formed on the substrate 110. The gate electrode 140 includes a transparent conductive layer 120 and a first metal layer 130. The source electrode 171 and the drain electrode 172 are formed by the second metal layer 170.

Wherein, the common electrode 121 is formed of the transparent conductive layer 120, and the transparent conductive layer 120 is placed on the substrate 110. The thin film transistor array substrate also includes a plurality of pixel electrodes 173, the pixel electrodes 173 which are formed by the second metal layer 170 on the gate insulative layer 150 corresponding to the common electrode 121, and the pixel electrodes 173 mutually connects the drain electrode 172.

The thin film transistor array substrate of an FFS liquid crystal display is formed just by three photo masks (known as the multi-tone mask, a second mask, and a third mask) according to the manufacturing method of the present invention. The present invention has less photo masks than prior art, thereby decreasing costs and time of manufacturing process.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing a thin film transistor array substrate, the method comprising the steps of:
   providing a substrate;
   depositing sequentially a transparent conductive layer and a first metal layer on the substrate by a sputtering process, and patterning the transparent conductive layer and the first metal layer by a multi-tone mask forming a gate electrode and a common electrode, the gate electrode having the transparent conductive layer and the first metal layer, and the common electrode being formed by the transparent conductive layer;
   depositing sequentially a gate insulative layer and a semi-conductive layer on the substrate with the gate electrode and the common electrode, and patterning the semi-conductive layer by a second mask for retaining a region of the semi-conductive layer being there-above the gate electrode;
   depositing a second metal layer on the substrate with the gate insulative layer along with the retained semi-conductive layer, and patterning the second metal layer by a third mask for forming a source electrode and a drain electrode on the retained semi-conductive layer, wherein a pixel electrode is formed by the second metal layer on the gate insulative layer corresponding to the common electrode; and
   depositing a planarization layer on the pixel electrode and on the source electrode, the drain electrode and the retained semi-conductor layer of the thin film transistor, wherein the planarization layer is formed of a transparent insulating material.

2. The method of claim 1, wherein the multi-tone mask is selected one group consisting of a gray tone mask, a stacked layer mask, and a half tone mask.

3. The method of claim 1, wherein the gate insulative layer and the semi-conductive layer are sequentially deposited by a chemical vapor deposition method.

4. The method of claim 1, wherein the second metal layer is formed by a sputtering process.

5. The method of claim 1, wherein the first metal layer is formed by a first aluminum metal layer and a first molybdenum metal layer being sequentially deposited, and the second metal layer is formed by a second molybdenum metal layer, a second aluminum metal layer and a third molybdenum metal layer being sequentially deposited.

6. The method of claim 1, wherein in the step of patterning the transparent conductive layer and the first metal layer by the multi-tone mask is utilized to form the gate electrode and the common electrode, the first metal layer is etched by a mixture of nitric acid, phosphoric acid and acetic acid, and the transparent conductive layer is etched by oxalic acid.

7. The method of claim 1, wherein in the step of patterning the second metal layer by a third mask to form the source electrode, the drain electrode and the pixel electrode, the second metal layer is etched by a mixture of nitric acid, phosphoric acid, and acetic acid.

8. A method for manufacturing a thin film transistor array substrate, the method comprising the steps of:
   providing a substrate;
   depositing sequentially a transparent conductive layer and a first metal layer on the substrate, and patterning the transparent conductive layer and the first metal layer by a multi-tone mask is utilized to form a gate electrode and a common electrode, wherein, the gate electrode comprises the transparent conductive layer and the first metal layer, and the common electrode is formed by the transparent conductive layer;
   depositing sequentially a gate insulative layer and a semi-conductive layer on the substrate with the gate electrode and the common electrode, and patterning the semi-conductive layer by a second mask for retaining a region of the semi-conductive layer that is there-above the gate electrode; and
   depositing a second metal layer on the substrate with the gate insulative layer along with the retained semi-conductive layer, and patterning the second metal layer by a third mask for forming a source electrode and a drain electrode on the retained semi-conductive layer, wherein a pixel electrode is formed by the second metal layer on the gate insulative layer corresponding to the common electrode.

9. The method of claim 8, further comprising:
   depositing a planarization layer on the pixel electrode and on the source electrode, the drain electrode and the retained semi-conductor layer of the thin film transistor, wherein the planarization layer is formed of a transparent insulating material.

10. The method of claim 8, wherein the multi-tone mask is selected one group consisting of a gray tone mask, a stacked layer mask, and a half tone mask.

11. The method of claim 8, wherein the transparent conductive layer and the first metal layer are sequentially formed by a sputtering process.

12. The method of claim 8, wherein the gate insulative layer and the semi-conductive layer are sequentially deposited by a chemical vapor deposition method.

13. The method of claim 8, wherein the second metal layer is formed by the sputtering process.

14. The method of claim 8, wherein the first metal layer is formed by a first aluminum metal layer and a first molybdenum metal layer being sequentially deposited, and the second metal layer is formed by a second molybdenum metal layer, a second aluminum metal layer and a third molybdenum metal layer being sequentially deposited.

15. The method of claim 8, wherein in the step of patterning the transparent conductive layer and the first metal layer by the multi-tone mask is utilized to form the gate electrode and the common electrode, the first metal layer is etched by a mixture of nitric acid, phosphoric acid and acetic acid, and the transparent conductive layer is etched by oxalic acid.

16. The method of claim 8, wherein in the step of patterning the second metal layer by a third mask to form the source electrode, the drain electrode and the pixel electrode, the second metal layer is etched by a mixture of nitric acid, phosphoric acid, and acetic acid.

* * * * *